United States Patent [19]

Haarer et al.

[11] 4,103,346
[45] Jul. 25, 1978

[54] NON-DESTRUCTIVE READOUT SCHEME FOR HOLOGRAPHIC STORAGE SYSTEM

[75] Inventors: Dietrich Haarer; Robert Vladimir Pole; Silvia Leonor Voelker, all of San Jose, Calif.

[73] Assignee: International Business Machines Corporation, Armonk, N.Y.

[21] Appl. No.: 769,150

[22] Filed: Feb. 16, 1977

[51] Int. Cl.² .................... G11C 13/04; G11C 7/00
[52] U.S. Cl. .................................. 365/216; 365/119
[58] Field of Search .................. 350/3.5; 340/173 R, 340/173 CC; 365/119, 121, 216

[56] References Cited

U.S. PATENT DOCUMENTS

| | | | |
|---|---|---|---|
| 3,568,167 | 3/1971 | Carson | 340/173 CC |
| 3,580,688 | 5/1971 | Schneider | 340/173 CC |
| 3,671,096 | 6/1972 | Mackin | 350/3.5 |
| 3,720,921 | 3/1973 | Schools et al. | 340/173 CC |
| 3,727,194 | 4/1973 | Schneider | 340/173 CC |
| 3,770,336 | 11/1973 | Roess | 350/3.5 |
| 3,846,764 | 11/1974 | Schneider | 340/173 CC |
| 3,896,420 | 7/1975 | Szabo | 340/173 CC |
| 4,041,476 | 8/1977 | Swainson | 340/173 CC |

Primary Examiner—Stuart N. Hecker
Assistant Examiner—Donald McElheny
Attorney, Agent, or Firm—Joseph E. Kieninger

[57] ABSTRACT

A non-destructive readout scheme suitable for use with a holographic storage system having data stored in three spatial dimensions and one frequency dimension is described. The readout scheme and the holographic storage system use a preferred storage material which undergoes a reversible photochromic reaction involving two inhomogeneously broadened absorption bands. Information is written into the storage system by exposing the material to a holographic interference pattern of light at a frequency within either one of the two absorption bands. The non-destructive readout scheme involves reconstructing the original information by sensing the change in the index of refraction at a frequency just outside of and near either one of the two absorption bands. The readout scheme also includes sensing refractive index changes near one or more narrow absorption lines within either absorption band.

11 Claims, 9 Drawing Figures

NON-DESTRUCTIVE READOUT SCHEME FOR HOLOGRAPHIC STORAGE SYSTEM

FIELD OF THE INVENTION

This invention relates to holographic read-write storage systems and more particularly, to a non-destructive readout for such a storage system.

BRIEF DESCRIPTION OF THE PRIOR ART

The growing demands of the computer industry stemming from increasing sophistication in programming and the need for greater system versatility has prompted the need for a low cost, high volume data storage system. As computers are applied to more general pattern recognition problems and as archival storage systems are realized, the need for inexpensive mass non-volatile storage will be increased.

Present storage media, for example, tapes, drums and discs, suffer from relatively slow access times and low storage density because the access is necessarily mechanical and the storage medium is two-dimensional. In contrast, optical storage systems are faster since they lend themselves to non-mechanical accessing techniques such as those based on electro-optical or acousto-optical light deflection methods. In addition, optical storage systems have higher storage densities, particularly if the information is stored holographically in three dimensions.

One type of holographic storage system utilizes photorefractive media such as lithium niobate. The information is written optically and read optically, for example, by sensing the variations of the refractive index of the material. These systems are either volatile, which is not desirable, or non-volatile. If they are not-volatile, they are either non-erasable or only erasable in bulk, both conditions being undesirable.

Another holographic storage system proposes the use of photochromic materials which have broad absorption spectra and induced spectra which are located spectrally a substantial distance away, such as that shown in the article by W. J. Tomlinson, *Applied Optics* 14, 2456 (1975). This effectively precludes three-dimensional storage because of the substantial wave length mismatch between the writing and the reading wave lengths.

Other types of readout schemes for conventional holographic storage systems are known. One type described in the patents to Gamblin et al., U.S. Pat. No. 3,656,827 and U.S. Pat. No. 3,737,878 involves the use of radially disposed photodetectors. A more commonly used approach is to convert the memory material to a salt and then measure the refractive index of the salt.

In a copending application to Castro et al., U.S. Pat. No. 4,101,976, filed February, 1977 and assigned to the assignee of this invention, an optical data storage system and method that utilizes the frequency dimension to increase the storage capacity significantly is described. The system includes a storage material adapted to undergo a photo-induced reaction upon exposure to light and which exhibits inhomogenous absorption line broadening. Data bits are stored by selective photo-induced reactions induced by a narrow band laser at specific frequencies within the broad inhomogeneous line. The lifetime of these phot-induced data bits is of the order of years so as to provide a non-volatile storage system. The Castro et al. application describes a three-dimensional optical storage system and suggests its use in a four-dimensional holographic storage system. However, the readout schemes which were directed to the three-dimensional storage systems are not as suitable for use in holographic systems.

SUMMARY OF THE INVENTION

It is a primary object of this invention to provide an improved readout scheme for a holographic storage system.

It is a further object of this invention to provide a non-destructive readout scheme for a holographic storage system.

It is another object of this invention to provide an improved holographic data storage system.

It is still another object of this invention to provide an improved frequency selective holographic memory device.

These and other objects are accomplished by a non-destructive readout scheme used with a holographic storage system having data stored in three spatial dimensions and one frequency dimension. The readout scheme and the holographic storage system use a preferred storage material which undergoes a reversible photochromic reaction involving two inhomogeneously broadened absorption bands. An example of a material is the free-base porphyrin ($H_2P$) incorporated in crystalline n-octane at a low temperature. Information is written into the storage system by exposing the material to a holographical interference pattern of light at a frequency within either one of the two absorption bands. The non-destructive readout scheme involves reconstructing the original information by sensing the change in the index of refraction at a frequency just outside of and near either one of the two absorption bands. In a preferred embodiment, the storage material is pretreated by photoreactively burning a series of holes in the inhomogeneously broadened band so that a plurality of narrow absorption lines exists prior to the writing step. Information is then written into the storage system by holographically burning off individual absorption lines at the appropriate frequencies. The readout scheme in this embodiment involves reconstructing the original information by sensing the change in the index of refraction near one or more of the absorption lines.

Other objects of this invention will be apparent from the following detailed description, reference being made to the accompanying drawing wherein a specific embodiment of the invention is shown.

DESCRIPTION OF THE ILLUSTRATIVE EMBODIMENT

A holographic storage system suitable for storing data in three spatial dimensions and one frequency dimension and having a non-destructive readout requires a particular type of storage material. The preferred storage material undergoes a reversible photochromic reaction involving two inhomogeneously broadened absorption bands. These preferred materials, when incorporated in a transparent crystalline host, for example, n-octane, and usually at low temperatures, exhibit the property of stable existence in either of two distinct states, each characterized by a different absorption band. This invention also includes storage materials which undergo an irreversible photochromic reaction.

Figure 1:
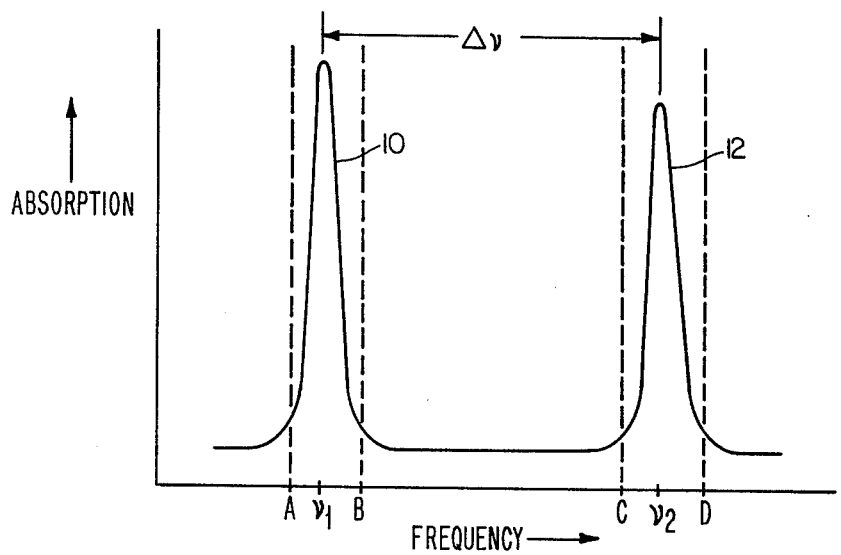
FIG. 1 illustrates the two inhomogeneous absorption bands of the material before exposure to a holographic interference pattern of light.

In FIG. 1, a pair of inhomogeneously broadened, photochromically related absorption bands is shown for such a preferred material in a host. One band 10 extends over a frequency range of A to B with a center frequency $\nu_1$ and a second band 12 extends over a frequency range C to D with a center frequency of $\nu_2$.

When the preferred material is exposed to the light of the frequency corresponding to the absorption band 10, all the molecules absorbing in this band are transferred into the other state characterized by the absorption band 12. The reverse is also true, i.e., all of the molecules absorbing in band 12 are transferred into the other state characterized by band 10 when exposed to light of the frequency corresponding to band 12. The recording or writing of information in this holographic storage system uses this photo-induced transformation and the accompanying change in the absorption band. Before any information is written into the storage system, the preferred material is prepared or treated so that only one of the two bands 10 or 12 exists.

Figure 2:
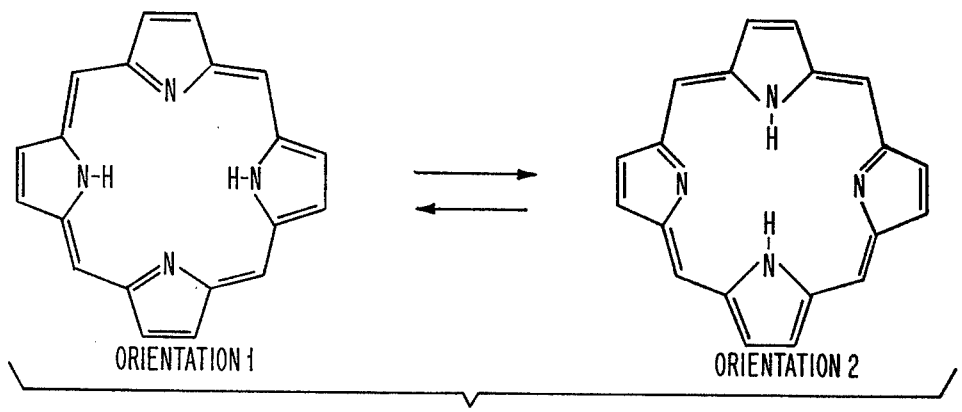
FIG. 2 illustrates the two orientations of the freebase porphyrin in a crystalline environment.

One such preferred material is the free-base porphyrin ($H_2P$) whose structure and the two possible orientations, with respect to the host crystal, are shown in FIG. 2. In this case, the planes of the $H_2P$ molecules are mutually parallel and the N-H and the H-N axes are at right angles with respect to one another. At liquid helium temperatures, $H_2P$ has absorption bands whose widths are in the order of a few wave numbers. The two photochromically related absorption bands are separated by about 70 wave numbers. A number of organic molecules of the class of porphyrins are suitable for use as a preferred material for this type of information storage. Other non-limiting examples are the deuterated free base porphyrin, tetrabenzo porphyrin, and phtalocyanine.

Figure 3:
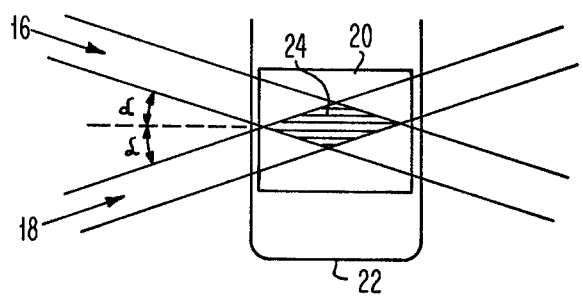
FIG. 3 illustrates schematically a system for writing information into the absorption bands.

In accordance with this invention, the photochemical writing of information in this storage system is accomplished holographically by means shown schematically in FIG. 3. A simple holographic pattern 24 is formed by two coherent, mutually intersecting laser beams 16 and 18 which intersect in the preferred storage material 20 which is located in a cryostat 22. When the preferred material has been prepared so that only the band 10 of FIG. 1 exists, all of the information is written directly into band 10 and indirectly into band 12. Similarly, when the preferred material has been prepared so that only the band 12 of FIG. 1 exists, all of the information is written directly into band 12 and indirectly into band 10. Hence, information can be written into either of the two photochromic bands. While a simple holographic pattern 24 has been shown, it is understood that more complex holograms consisting of a reference beam and a complicated object beam may also be recorded. Holograms may also be recorded in succession, if desired.

The information so recorded can, in principle, be readout in the standard holographic manner by illuminating the material with the original reference beam of the same frequency. This, however, would also destroy the recorded information and be a destructive readout scheme.

Figure 4:
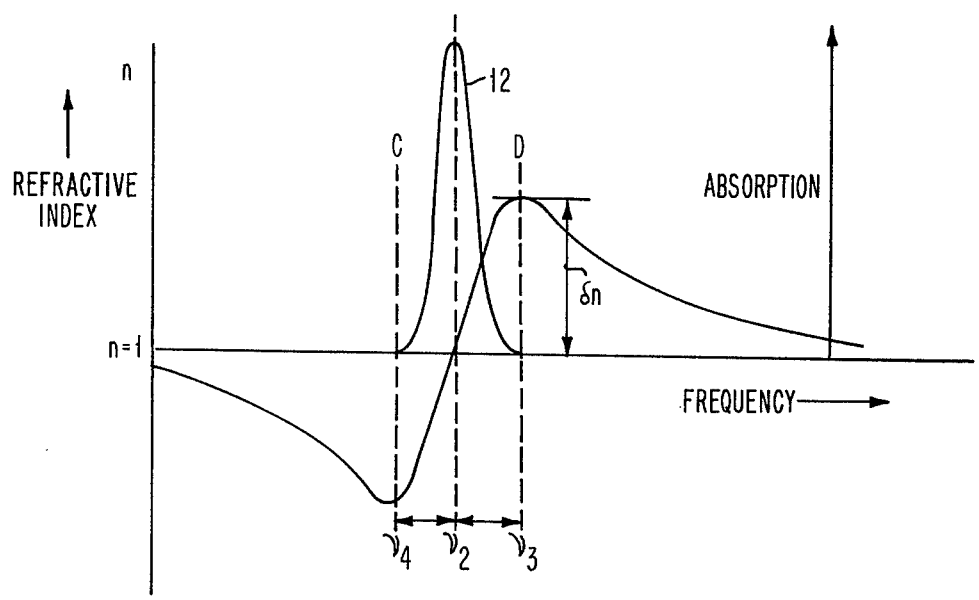
FIG. 4 illustrates the dispersion of the refractive index of the material associated with either one of the two absorption bands of FIG. 1.

In accordance with this invention, the non-destructive readout scheme consists of reconstructing the written holograms with a reference beam of a frequency which is just outside of and near either one of the two absorption bands. At this frequency, the information is detected by sensing the spatial variations of the refractive index changes which always accompany the changes in absorption. When the information has been written into band 10 directly in the preferred material, all of the molecules are transferred into the state characterized by absorption band 12. FIG. 4 illustrates this dispersion of the refraction index in the vicinity of the absorption band 12. FIG. 4 illustrates the well known relationship that exists between the absorption band and the refractive index. The readout frequency $\nu_3$ or $\nu_4$ is chosen so that the absorption is at the minimum but as close to the band edge as reasonable so that the dispersion for the index of refraction is as high as possible. The frequency $\nu_3$ and $\nu_4$ shown in FIG. 4 are located a distance of about one band or line width from $\nu_2$, the frequency in the center of the absorption band 12.

This readout scheme also includes sensing the spatial variations of the refractive index change outside of and near where band 10 (not shown in FIG. 4) used to be. Hence, in a preferred material, one has the option of reading the information either near band 10 or near band 12.

Figure 5:
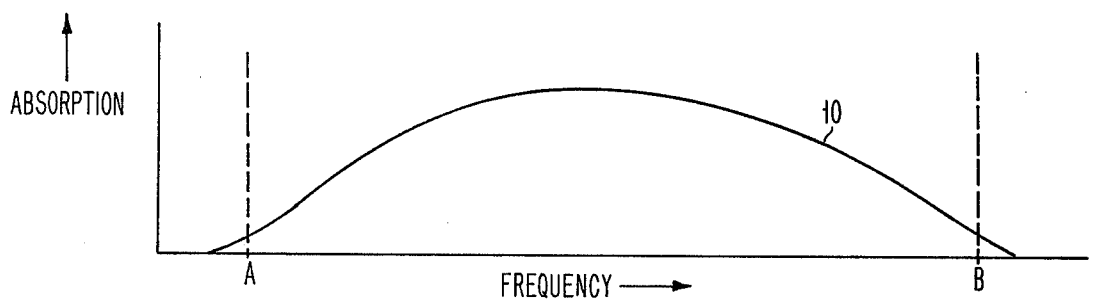
FIG. 5 illustrates one of the absorption bands of FIG. 1 with the frequency dimension expanded before the writing step.
Figure 6:
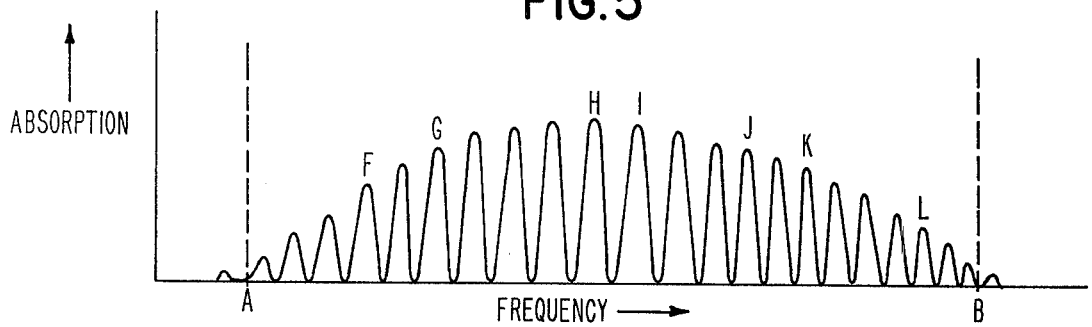
FIG. 6 illustrates a pretreated storage material having a plurality of absorption lines.

In accordance with a preferred embodiment of this invention, the preferred material is pretreated so that one of the inhomogeneously broadened absorption bands, say band 10, shown on an expanded frequency scale in FIG. 5, is converted into a band consisting of a number of narrow absorption lines as shown in FIG. 6. This is accomplished by uniformly exposing the material to a number of laser frequencies whose band widths are much narrower than that of the inhomogeneously broadened band.

This process is known as photo-reactive hole burning. It is of the same photochromic nature as described above except that it involves only those molecules which absorb within a certain narrow laser band width. The other molecules in the material which absorb at frequencies other than the hole burning frequency are unchanged since they don't participate in the photo-induced reaction.

Figure 7:
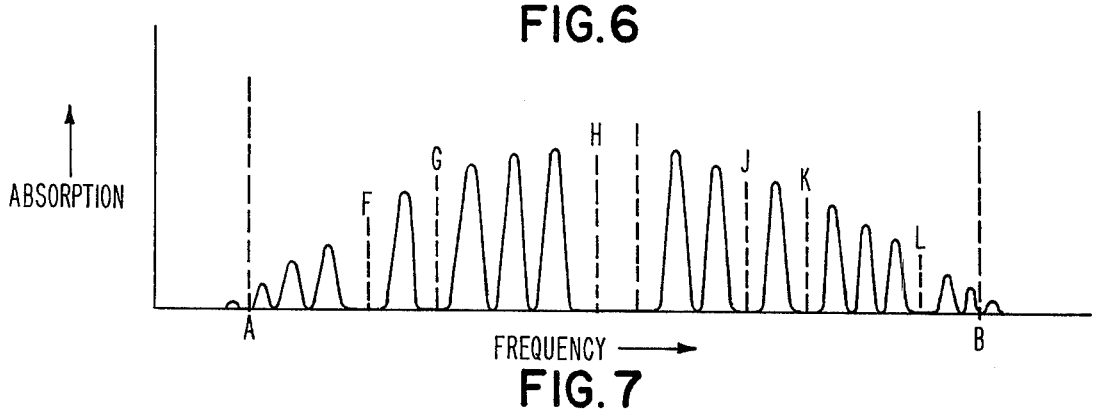
FIG. 7 illustrates the FIG. 6 absorption band after the writing step.

Each one of the newly generated narrow absorption peaks shown in FIG. 6 can be used to store in it a set of spatially differently produced holograms. At this point, there is no specific information in the absorption line pattern of FIG. 6. Specific information is written holographically into the absorption spectra shown in FIG. 6 by means previously described at specific frequencies, for example, F, G, H, I, J, K and L. The resultant spectra is shown in FIG. 7. The non-destructive readout is accomplished as before, preferably in the vicinity of these narrow absorption lines in the specific manner described in detail for FIG. 4, for example, near the frequencies F, G, H, I, J, K and L, shown in FIG. 7. In other words the reflective index change is observed for every line in FIG. 7 in the same mode as described in FIG. 4. Adjacent to frequencies F, G. H. etc., however, there would be no refractive index change which corresponds to FIG. 4. Hence, when one does not detect a refractive index change of this type, it means that a specific piece of information has been stored at this frequency. The readout may also be performed near the induced absorption lines of band 12 (not shown).

While the preferred embodiment illustrated by FIGS. 5, 6 and 7 uses a preferred material which undergoes a reversible photochromic reaction, this readout scheme will also work on a material which undergoes an irreversible photochromic reaction. An example of a material which undergoes an irreversible photochemical reaction is tetrazine. This type of material has only one absorption band, for example band 10, and all readouts are made on that band. This type of material does not permit erasing of the information as does the preferred material.

Figure 8:
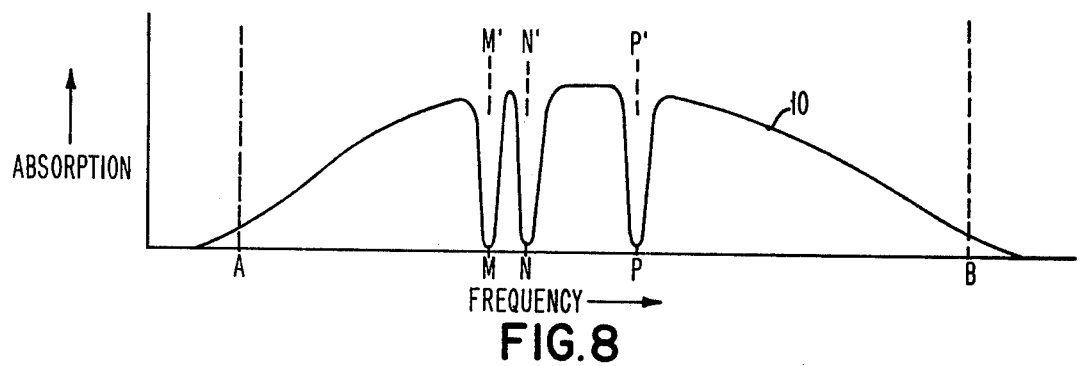
FIG. 8 illustrates the FIG. 5 absorption band of the material after the writing step.
Figure 9:
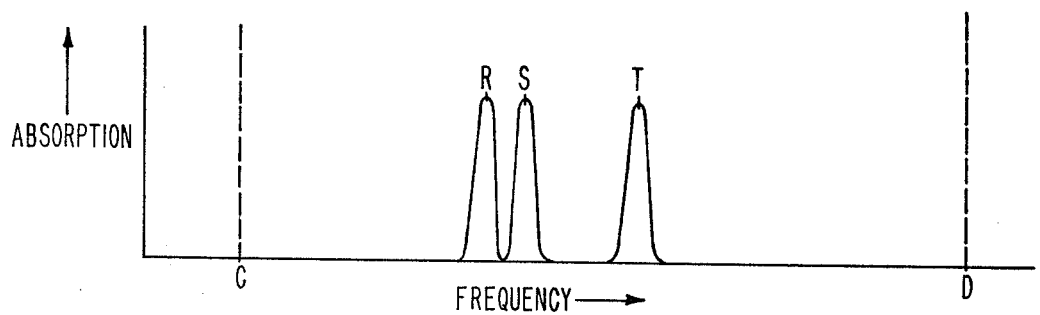
FIG. 9 illustrates the other absorption band after the writing step.

In another embodiment of this invention using a preferred material, individual sets of holograms are written in one of the untreated bands, say band 10 shown in FIG. 5, by burning spectral holes at individual hole frequencies M, N, P to yield the resultant spectra shown in FIG. 8. The non-destructive readout is achieved by reading the information with reference beams tuned preferably to the frequencies close to the corresponding induced absorption peaks R, S and T in the band 12 shown in FIG. 9. The induced absorption lines of the type shown in FIG. 9 (R, S and T) are believed to be present, based upon present theory. This invention, however, is not limited to such a theory.

In either of the above-described embodiments, the amount of information stored in the material will be proportional both to the number of holograms that can be stored in a given volume of the material times the number of spectral holes that can be burned in an inhomogeneously broadened band of such photochromic material.

Although a preferred embodiment of this invention has been described, it is understood that numerous variations may be made in accordance with the principles of this invention.

What is claimed is:

1. A non-destructive readout scheme suitable for use with a holographic storage system having information stored in three spatial dimensions and one frequency dimension comprising
   a material exhibiting inhomogeneous absorption line broadening, said material adapted to undergo a photochromic reaction involving information stored in the non-volatile ground state of molecules upon exposure to a light source having a wavelength bandwidth narrower than the inhomogeneous line width, said broadened line having information stored at one or more first frequencies within said broadened line, and
   means to sense the spatial variations of the refractive index changes at one or more second frequencies adjacent said first frequencies, said second frequencies being in the vicinity of one line width from said first frequency and being within said broadened line.

2. A non-destructive readout scheme as described in claim 1 wherein said first band has a plurality of absorption lines therein.

3. A non-destructive readout scheme as described in claim 2 wherein said material has undergone at least one photochemical reaction to cause at least one of said lines to be burned.

4. A non-destructive readout scheme suitable for use with a holographic storage system having information stored in three spatial dimensions and one frequency dimension comprising
   a material having a first inhomogeneously broadened absorption line and a second inhomogeneously broadened absorption line, said material adapted to undergo a reversible photochromic reaction involving information stored in the non-volatile ground state of molecules upon exposure to a light source having a wavelength bandwidth narrower than the inhomogeneous line width, said broadened lines having information stored at one or more first frequencies within said broadened lines, and
   means to sense the spatial variations of the refractive index changes at one or more second frequencies adjacent said first frequencies, said second frequencies being in the vicinity of one line width from said first frequency and being within said broadened lines.

5. A non-destructive readout scheme as described in claim 4 wherein said means is adapted to sense the changes at said second frequencies dealing with said first broadened lines.

6. A non-destructive readout scheme as described in claim 4 wherein said means is adapted to sense the changes at said second frequencies dealing with said second broadened lines.

7. A holographic storage system having information stored in three spatial dimensions and one frequency dimension comprising
   a material having a first inhomogeneously broadened absorption line, said material adapted to undergo a photochromic reaction involving information stored in the non-volatile ground state of molecules upon exposure to a light source having a wavelength bandwidth narrower than the inhomogeneous line width,
   writing means adapted to record information on said band at one or more first frequencies within said broadened line, and
   means to sense the spatial variations of the refractive index changes at one or more second frequencies adjacent said frequency, said second frequencies being in the vicinity of one line width from said first frequency and being within said broadened line.

8. A method of reading information in a holographic storage system having information stored in three spatial dimensions and one frequency dimension, said information being stored on an inhomogeneously broadened absorption line at one or more first frequencies within said broadened line comprising the steps of
   sensing the spatial variations of the refractive index changes at one or more second frequencies adjacent said first frequencies, said second frequencies being in the vicinity of one line width from said first frequency and being within said broadened line.

9. A method of reading information in a holographic storage system having information stored in three spatial dimensions and one frequency dimension, said information being stored on a first and a second inhomogeneously broadened absorption line at one or more first frequencies within said broadened lines comprising the steps of sensing the spatial variations of the refractive index changes at one or more second frequencies adjacent said first frequencies, said second frequencies being in the vicinity of one line width from said first frequency and being within said broadened line.

10. A method as described in claim 9 whereby said sensing step is performed at said second frequencies dealing with said first band.

11. A method as described in claim 9 whereby said sensing steps is performed at said second frequencies dealing with said second band.

* * * * *